United States Patent
Hsieh

(10) Patent No.: US 7,989,887 B2
(45) Date of Patent: Aug. 2, 2011

(54) TRENCH MOSFET WITH TRENCHED FLOATING GATES AS TERMINATION

(75) Inventor: Fu-Yuan Hsieh, Banciao (TW)

(73) Assignee: Force Mos Technology Co., Ltd., Taipei (TW)

( * ) Notice: Subject to any disclaimer, the term of this patent is extended or adjusted under 35 U.S.C. 154(b) by 13 days.

(21) Appl. No.: 12/591,467

(22) Filed: Nov. 20, 2009

(65) Prior Publication Data

US 2011/0121386 A1    May 26, 2011

(51) Int. Cl.
*H01L 27/108* (2006.01)
(52) U.S. Cl. ........ 257/330; 257/329; 257/331; 257/332; 257/333; 257/341; 257/374; 257/E29.201

(58) Field of Classification Search .......... 257/329–333, 257/341, 374
See application file for complete search history.

(56) References Cited

U.S. PATENT DOCUMENTS

| | | | |
|---|---|---|---|
| 7,781,826 B2 * | 8/2010 | Mallikararjunaswamy et al. | 257/328 |
| 2009/0108343 A1 * | 4/2009 | Nemtsev et al. | 257/330 |
| 2010/0044796 A1 * | 2/2010 | Hshieh | 257/365 |

* cited by examiner

*Primary Examiner* — Wai-Sing Louie
(74) *Attorney, Agent, or Firm* — Bacon & Thomas, PLLC

(57) ABSTRACT

A trench MOSFET comprising a plurality of transistor cells with a plurality of wide trenched floating gates as termination region is disclosed. The trenched floating gates have trench depth equal to or deeper than body junction depth of body regions in termination area. Each body region between two adjacent said trenched floating gates has floating voltage.

22 Claims, 20 Drawing Sheets

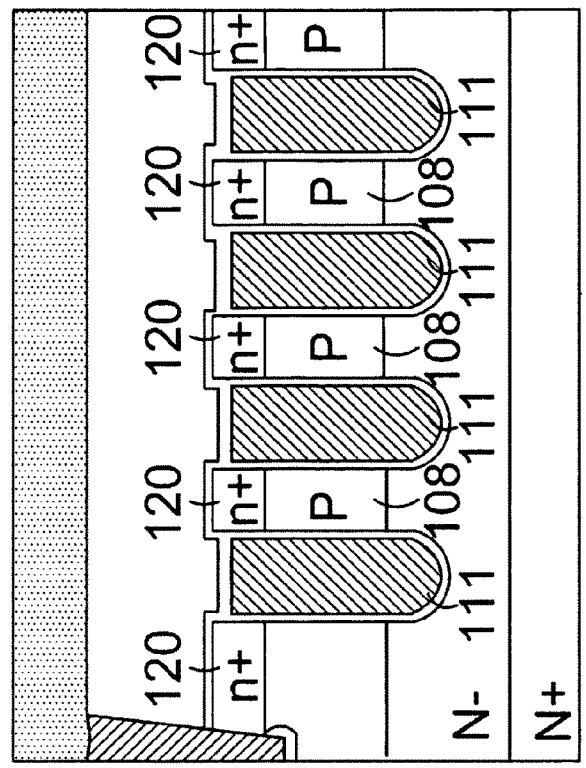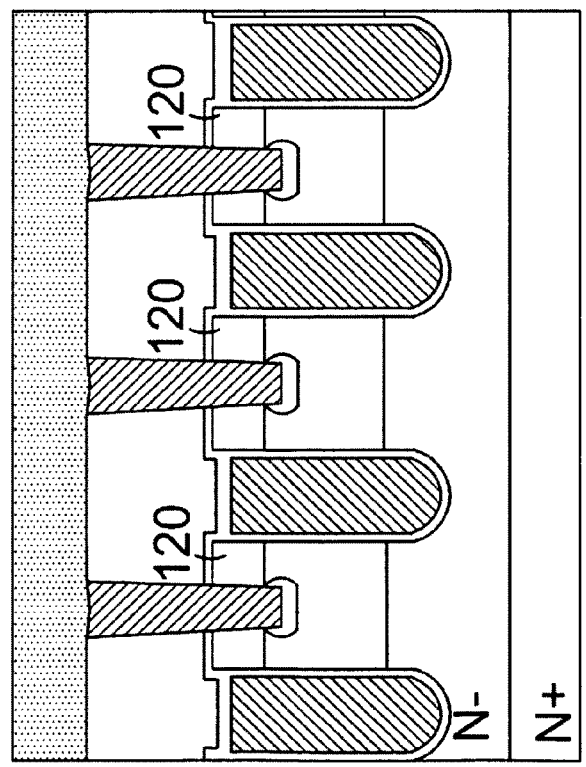
Fig.1A (PRIOR ART)

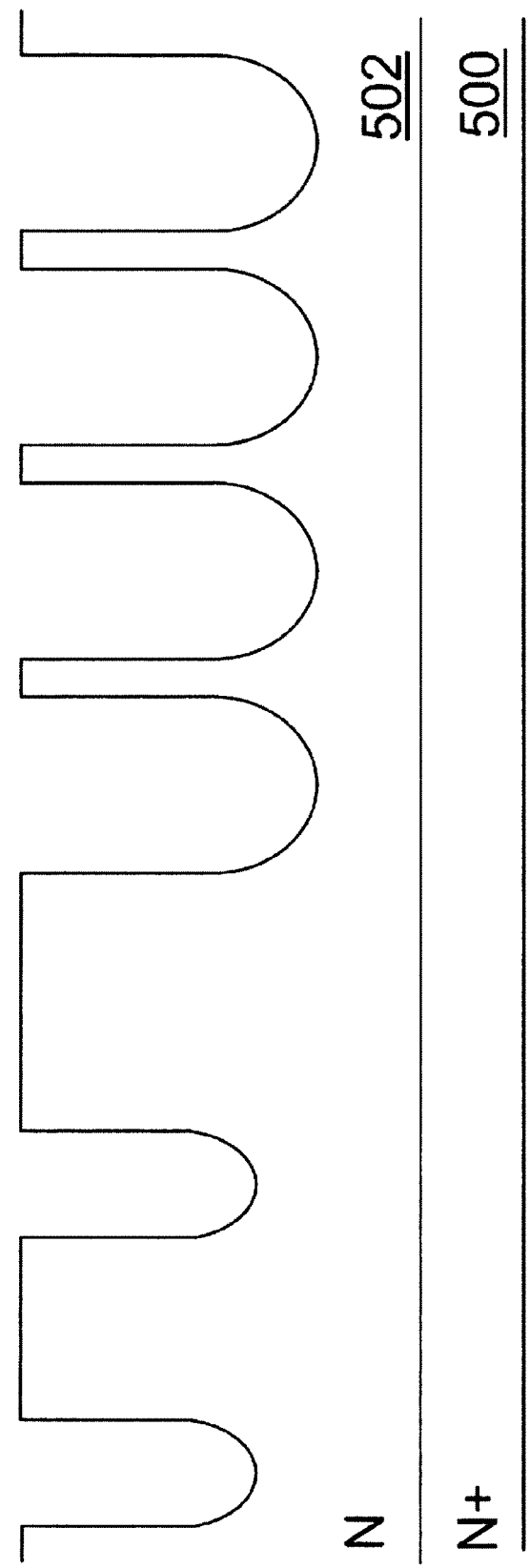

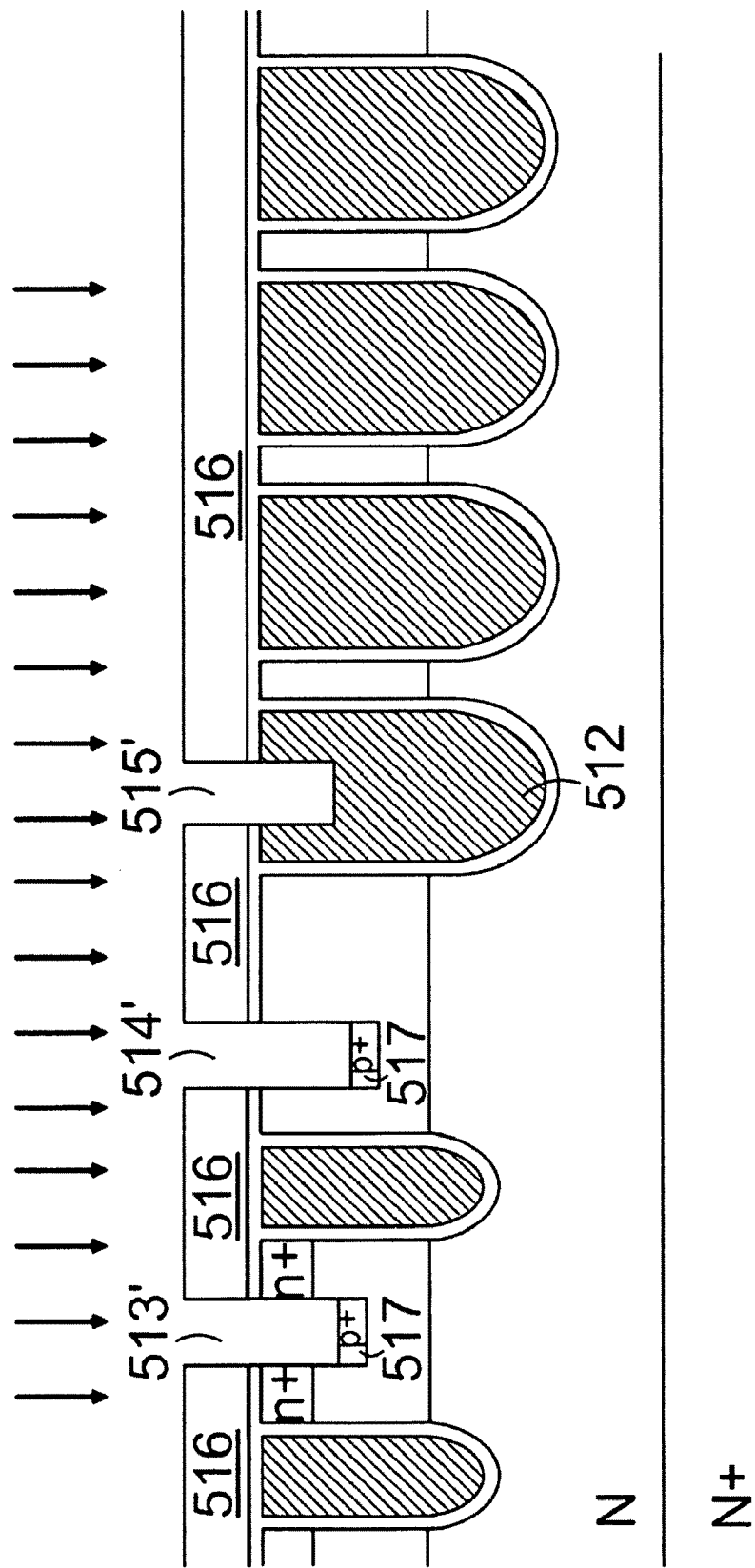

TRENCH MOSFET WITH TRENCHED FLOATING GATES AS TERMINATION

FIELD OF THE INVENTION

This invention relates generally to the cell structure, device configuration and fabrication process of power semiconductor devices. More particularly, this invention relates to a novel and improved cell structure, device configuration and improved process for fabricating a trench semiconductor power device with trenched floating gates as termination to maintain a high breakdown voltage and to achieve a lower gate to drain charge Qgd and lower fabrication cost.

BACKGROUND OF THE INVENTION

Typical structures of trench MOSFETs having trenched floating gates as termination in prior arts are encountering technical problems. For example, in U.S. Pat. No. 6,462,376, a trench MOSFET was disclosed with n+ source region disposed in termination area comprising a plurality of trenched floating gates, as shown in FIG. 1A. In termination area, n+ source region 120 is disposed between two adjacent trenched floating gates 111. This kind of structure will cause heavily leakage current between drain region and source region as result of the channel is turned on in termination area due to floating P body regions 108 and the trenched floating gates 111 are not shorted together with source regions at drain/source reversed bias. An electrical current will flow from drain through channel region of the trenched floating gate and n+ source region 120 between two adjacent trenched floating gates 111 in termination area to the source region 120 in active area.

U.S. Pat. No. 7,511,339 disclosed another trench MOSFET structure without having n+ source region in termination area but with depth of trenched gates 110 shallower than depth of floating deep P body regions 130, as shown in FIG. 1B. However, from experimental results of the relationship between breakdown voltage (BV) and difference between depth of trenched floating gates (TFd) and depth of body region (Pd) in FIG. 2, we can see that, the breakdown voltage is significantly degraded when depth of trenched floating gate is shallower than deep body region, thus causing low breakdown voltage in termination area due to poor isolation between drain region and source region by the shallower trenched floating gates in termination area. The floating deep P body 130 regions are electrically connected together by charge depletion of the floating P body regions at drain-source reversed bias because the trenched floating gates is shallower than the floating P body. Therefore, an electrical current will directly flow from edge of the termination area to source region in active area without blocking by the shallower trenched floating gates in the termination.

Therefore, there is still a need in the art of the semiconductor device fabrication, particularly for trench MOSFET design and fabrication, to provide a novel cell structure, device configuration and fabrication process that would resolve these difficulties and design limitations. Specifically, it is desirable to maintain low breakdown voltage in termination area of a trench MOSFET.

SUMMARY OF THE INVENTION

The present invention provides trench MOSFET having a plurality of transistor cells in active area and multiple trenched floating gates in termination area, specifically, the trench depth of the trenched floating gates in termination area is equal to or deeper than junction of body region surrounding the trenched floating gates without having source region disposed wherein to maintain high breakdown voltage. Some preferred trench MOSFET transistor cells exhibit low gate to drain charge Qgd.

In one aspect, the invention features a trench MOSFET having a plurality of transistor cells in active area and multiple trenched floating gates in termination area with each of said transistor cell further includes (a) a substrate of a first conductivity type; (b) an epitaxial layer of said first conductivity type grown on said substrate, said epitaxial layer having a lower doping concentration than said substrate; (c) a plurality of source regions of said first conductivity type formed near top surface of said epitaxial layer only within said active area, said source regions having a doping concentration higher than said epitaxial layer; (d) a plurality of first type body regions of a second conductivity type formed beneath said source regions in said active area; (e) a plurality of second type body regions of said second conductivity type formed into said epitaxial layer from top surface of said epitaxial layer around outside of said active area including said termination area, and said source regions being not disposed in the top of said second type body regions; (f) an insulation layer formed on said epitaxial layer; (g) a plurality of first type trenches in said active area surrounded by said source regions and said first type body regions, extending into said epitaxial layer and filled with gate conductive layer over gate oxide layer as first type trenched gates of said transistor cells for current conduction; (h) at least one second type trenched gate having gate oxide layer formed thereon, said second trenched gate being wider and deeper than said first type trenched gates, surrounded by said second type body regions and extending into said epitaxial layer and filled with gate conductive layer as trenched gates for gate connection; (i) at least three third type trenched gates in parallel formed in termination area around outside of said active area having said gate oxide layer formed thereon, said third type trenched gates surrounded by second type body regions and extending into said epitaxial layer and filled with said gate conductive layer as trenched floating gates with floating voltage for sustaining breakdown voltage in termination area, said third type trenched gates having trench depth equal to or deeper than body junction of said second type body regions, and each of said second type body regions between two adjacent said trenched floating gates in termination area having floating voltage; (j) a plurality of trenched source-body contacts filled with metal plugs padded by a barrier layer, each penetrating through said insulation layer and one of said source regions and extending into one of said first type body regions between two adjacent said first type trenched gates, said metal plugs being connected to a first metal layer formed on said insulation layer as source metal; (k) at least one trenched gate contact filled with said metal plug padded by said barrier layer, penetrating through said insulation layer and extending into said gate conductive layer, said metal plug being connected to a second metal layer on said insulation layer serving as gate metal; and (l) a drain metal on rear side of said substrate.

Preferred embodiments include one or more of the following features. There is a body contact region of said second conductivity type underneath each of said plurality of trenched source-body contact, said body contact region having a higher doping concentration than said first body region. Said third type trenched gates as trenched floating gates in said termination area have same trench width and depth as said first type trenched gates in said active area. Said third type trenched gates as trenched floating gates in said termination area have wider trench width than said first type trenched gates in said active area. The width of said third type trenched gates as trenched floating gates in said termination area increases or decreases toward the edge of said termination area. Said first type trenched gates in said active area are equal to or shallower than said first type body region. Said first type trenched gates in said active area are deeper than said first type body region. There is a doped region of said first conductivity type with doping concentration higher than said epitaxial layer wrapping each bottom of said first type trenched gates in said active area, said second type trenched gate for gate connection and said third type trenched gates in said termination area. The trench space between every two adjacent of said third type trenched gates in termination area is equal or increased toward the edge of said termination area. There is a trenched body contact filled with said metal plug padded by a barrier layer, penetrating through said insulation layer and extending into said second type body region between said first type trenched gate and adjacent said second type trenched gate, said metal plug being connected to said source metal.

The invention also features a method of making a trench MOSFET having a plurality of transistor cells in active area and multiple trenched floating gates in termination area including (a) growing an epitaxial layer with a first conductivity type upon a heavily doped substrate with a first conductivity type; (b) applying a trench mask and forming a plurality of first type gate trenches in source metal area, at least a second type gate trench having gate trench wider than said first type gate trench in gate runner metal area, and multiple third type gate trenches in termination area; (c) growing a sacrificial oxide layer onto inner surface of all the gate trenches to remove the plasma damage; (d) removing said sacrificial oxide and growing or depositing a first insulation layer along inner surface of said first, second and third type gate trenches as gate oxide; (e) depositing doped polysilicon with said first conductivity type into said first, second and third type gate trenches and etching back said doped polysilicon; (f) implanting said epitaxial layer with a second conductivity type dopant and diffusing it to form body regions without having body mask; (g) implanting said epitaxial layer with a first conductivity type dopant through source mask and diffusing it to form source regions; (h) depositing a second insulation layer functioning as thick oxide interlayer on the top surface of said epitaxial layer and said first, second and third type trenched gates; (i) applying a contact mask and dry oxide etching to remove said oxide interlayer from contact open areas; (j) forming trenched source-body contact into body region and trenched gate contact into doped polysilicon in said second type gate trench by dry silicon and polysilicon etching through said contact open areas, respectively and simultaneously, and (k) ion implanting said trenched source-body contact with a dopant having said second conductivity type and activating it by RTA to form body contact area with said second conductivity type around bottom of said trenched source-body contact.

Preferred embodiments include one or more of the following features. Said trenched source-body contacts and said trenched gate contacts are filled with Ti/TiN/W or Co/TiN/W metal plugs connecting with a resistance-reduction layer of Ti or Ti/TiN underneath said source metal of Al alloys. Said trenched source-body contacts and said trenched gate contacts are filled with source metal such as Ti/TiN/Al alloys or Co/TiN/Al alloys.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIG. 1A is a cross-sectional view of a trench MOSFET of prior art.

FIGS. 15A~15E are a serial of side cross-sectional views for showing the processing steps for fabricating the trench MOSFET with wide trenched floating gates as termination as shown in FIG. 10.

DETAILED DESCRIPTION OF THE EMBODIMENTS

Figure 1B:
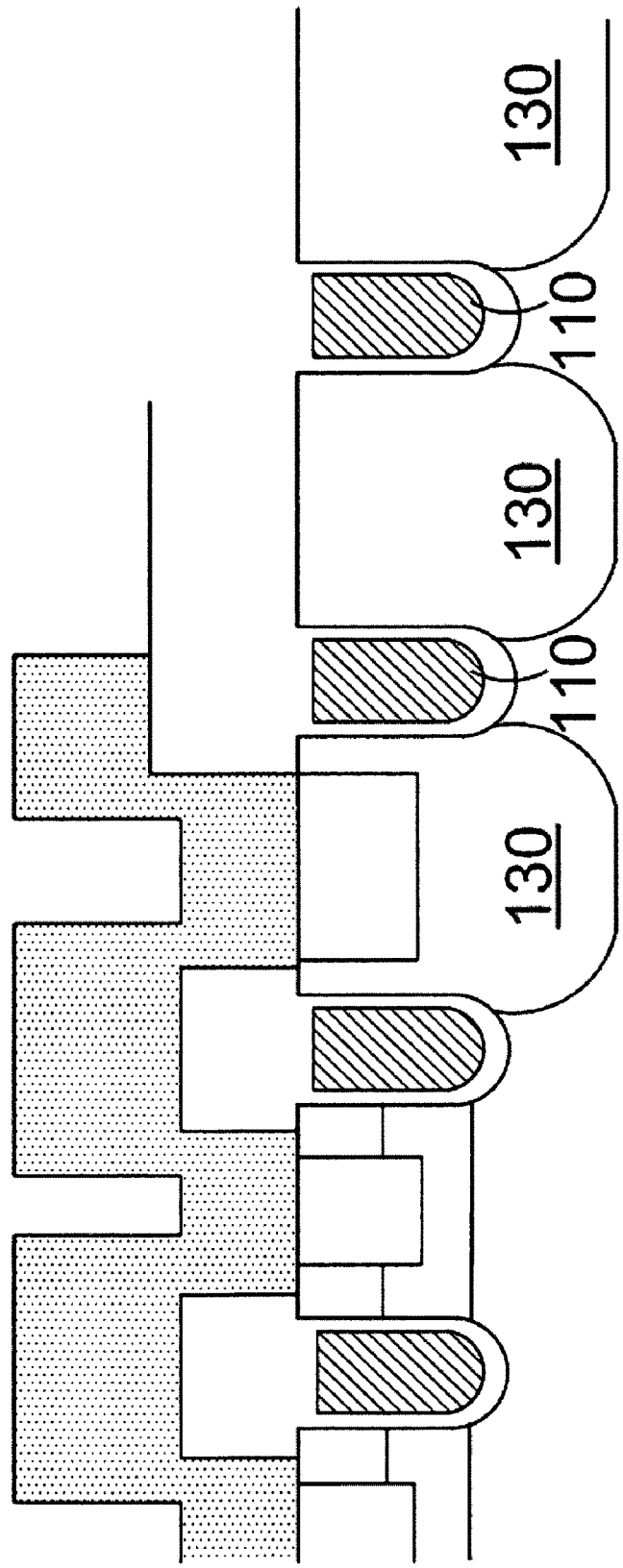
FIG. 1B is a cross-sectional view of a trench MOSFET of another prior art.
Figure 2:
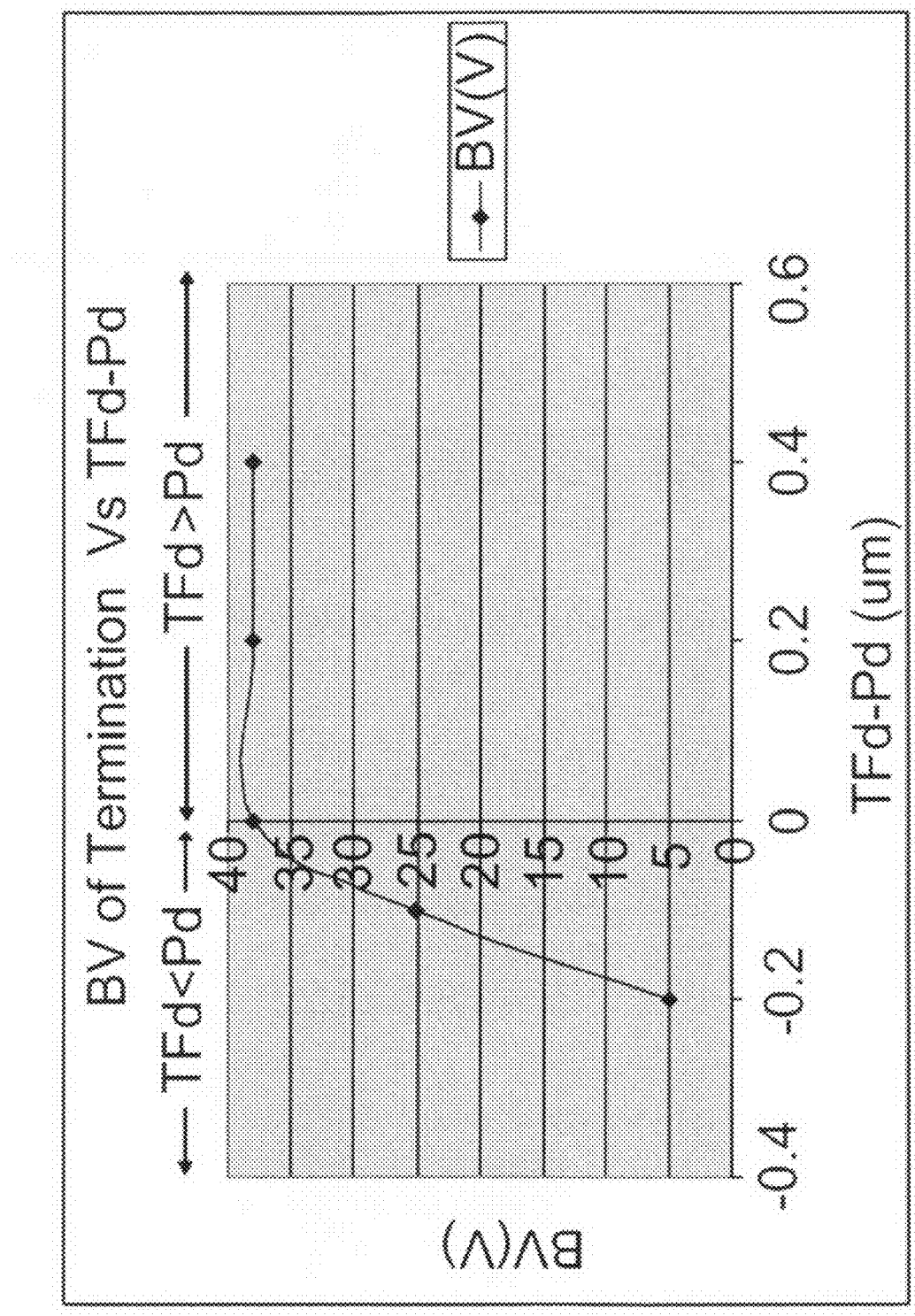
FIG. 2 is an experimental curve showing the relationship between breakdown voltage (BV) and the difference between depth of trenched floating gates and depth of body region (TFd-Pd).
Figure 3:
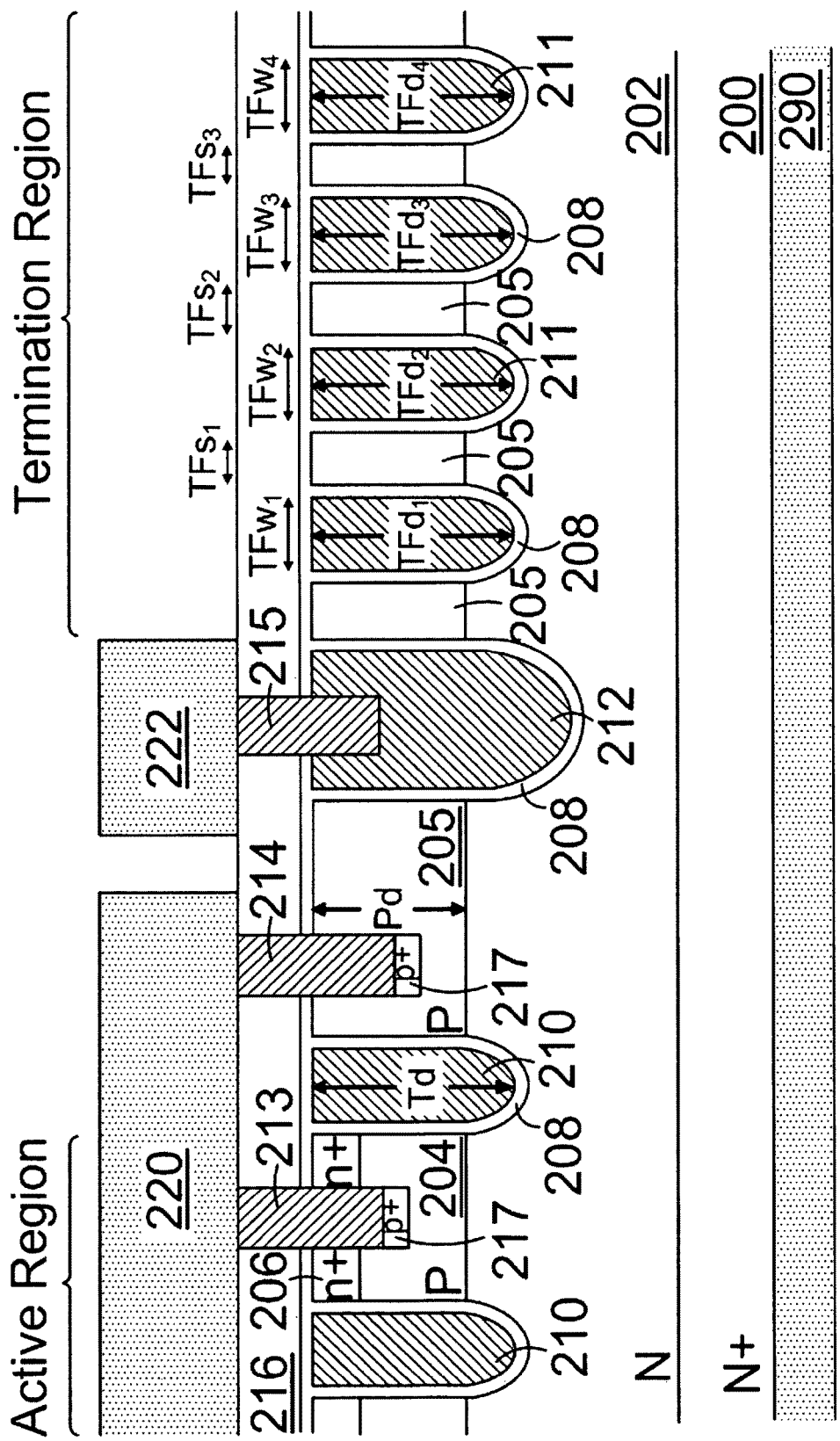
FIG. 3 is a cross-sectional view of a preferred embodiment according to the present invention.

Please refer to FIG. 3 for a preferred embodiment of this invention where an N-channel trench MOSFET cell is formed on an N+ substrate 200 with a metal layer 290 on the rear side as drain. Inside an N-epitaxial layer 202 onto said N+ substrate 200, a plurality of first type trenched gates 210 are formed in active area, at least a wider second type trenched gate 212 is formed to be connected to gate pad, and a plurality of third type trenched floating gates 211 are formed in termination area. Said plurality of first type trenched gates 210, said at least a wider second type trenched gates 212 and said plurality of third type trenched floating gates 211 are all filled with doped polysilicon padded by a gate oxide layer 208. Furthermore, said plurality of third type trenched floating gates 211 have same trench width which are the same as said plurality of first type trenched gates 210 in active area, meanwhile, the trench space between every two adjacent said plurality of third type trenched floating gates 211 in termination area is equal or increased toward the edge of said termination area. In upper portion of said N epitaxial layer 202, first type P body regions 204 are extending between every two adjacent of said plurality of first type trenched gates 210; second type P body regions 205 are formed around outside the active area. Near the top surface of said first type P body regions 204, n+ source regions 206 are formed adjacent to sidewalls of said plurality of first type trenched gates 210. Specifically, the depth of said plurality of third type trenched gates 211 ($TFd_1$, $TFd_2$, $TFd_3$, as shown in FIG. 3) must be equal or deeper than junction depth of said second type body region 205 (Pd, as shown in FIG. 3) surrounding said third type trenched gates without having source region disposed wherein to maintain high breakdown voltage while preventing heavily leakage current, and the depth of said plurality of first type trenched gates 210 are deeper than junction depth of said first type P body regions 204. The N-channel trench MOSFET cell further comprises trenched source-body contact 213, trenched body contact 214 and trenched gate contact 215. Each of said trenched source-body contact 213 is penetrating through a contact interlayer 216, said source regions 206 and extending into said first type P body region 204, each of said trenched body contact 214 is penetrating through said contact interlayer 216 and extending into said second type P body region 205, each of said trenched gate contact 215 is penetrating through said contact interlayer 216 and extending into filling-in doped polysilicon within said second type trenched gate 212. Underneath each of said trenched source-body contact 213 and said trenched body contact 214, there is a p+ body contact region 217 to further reduce contact resistance. The N-channel trench MOSFET cell further comprises source metal 220 and gate metal 222, said source metal 220 is connected to said n+ source regions 206, said first type P body region 204 and said second type P body region 205 via metal plugs filled into said trenched source-body contact 213 and said trenched body contact 214, said gate metal 222 is connected to said at least a wider second trenched gate 212 via metal plugs filled into said trenched gate contact 215. Since the structure does not have n+ source region between two adjacent trenched floating gates, no current will flow from drain region 200 through channel region between two adjacent trenched floating gates to source region 206 in the active area even the trenched floating gates are turned on. Said N-channel trench MOSFET further comprises a plurality of closed transistor cells, as shown in FIG. 4 or a plurality of stripe transistor cells, as shown in FIG. 5

Figure 4:
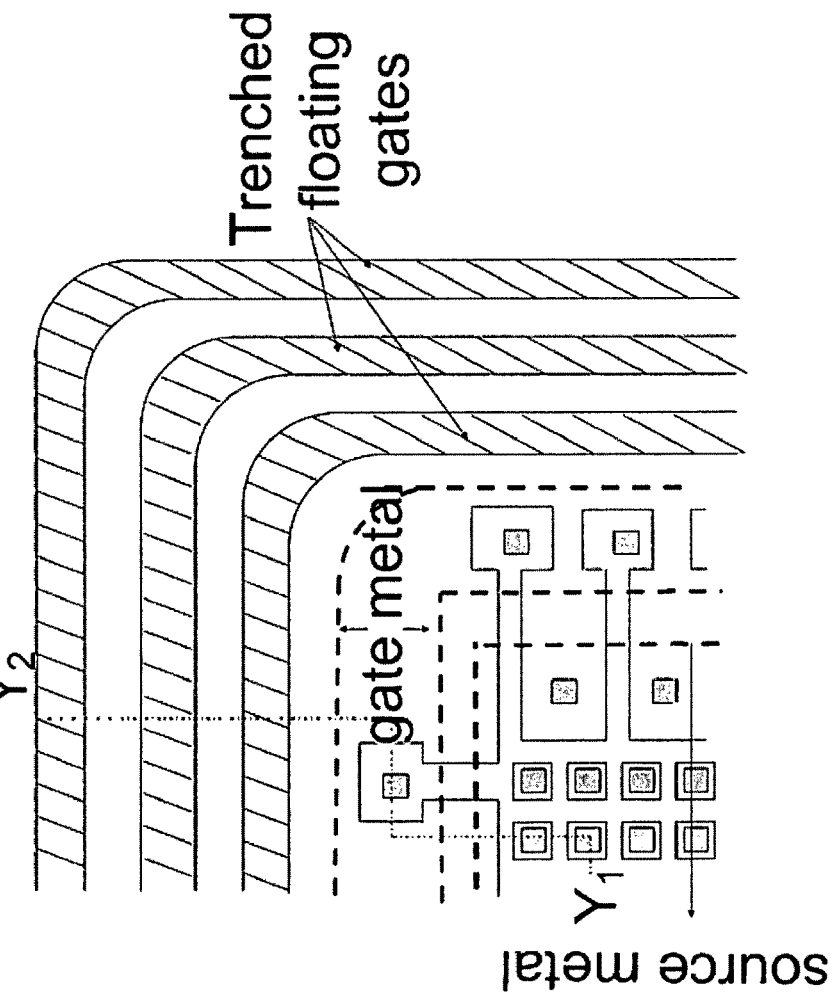
FIG. 4 is a top view of closed cell with trenched floating gates according to the present invention.
Figure 5:
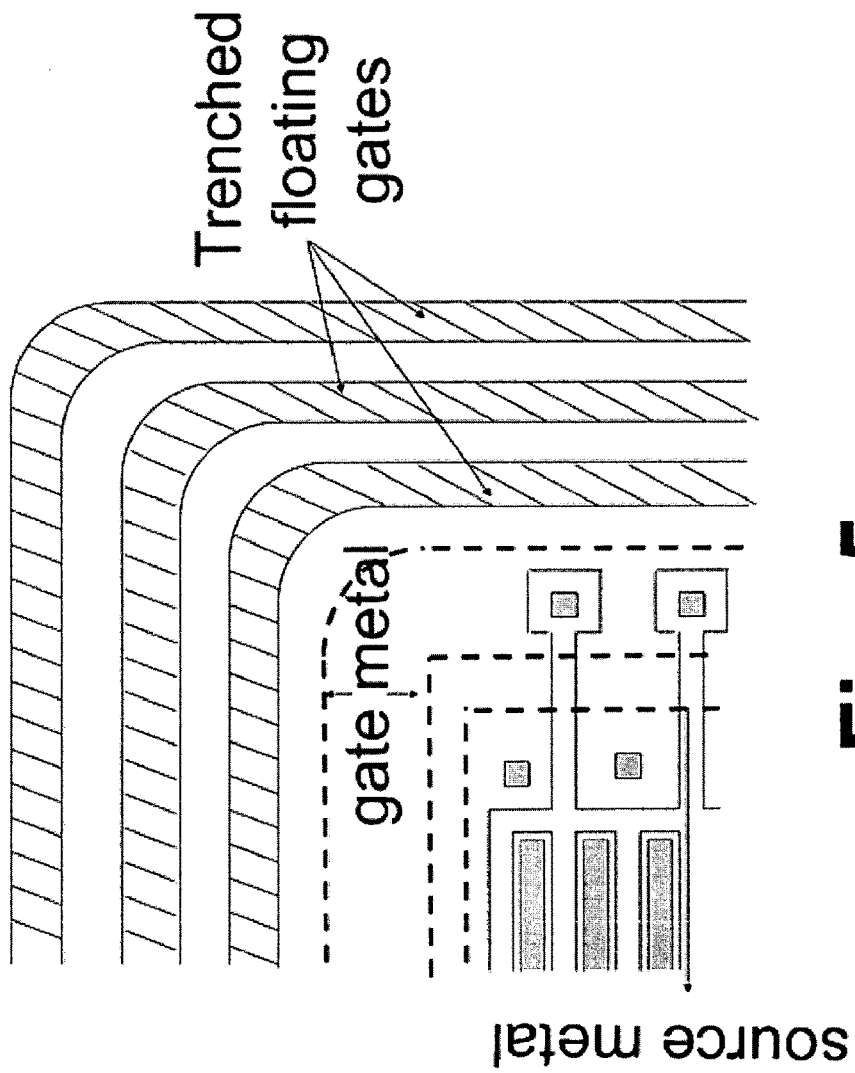
FIG. 5 is a top view of stripe cell with trenched floating gates according to the present invention.
Figure 6:
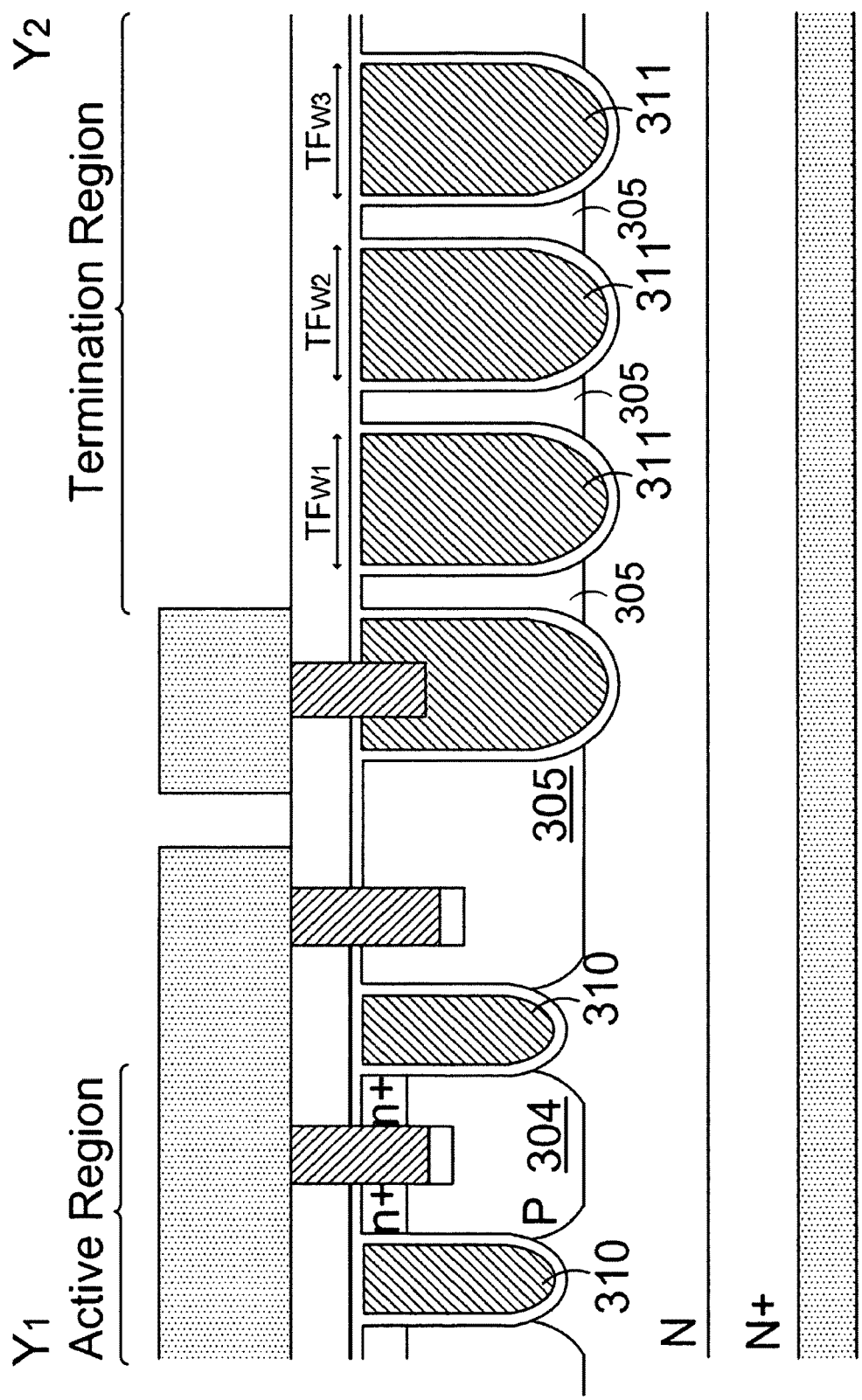
FIG. 6 is a cross-sectional view of another preferred embodiment according to the present invention.
Figure 7:
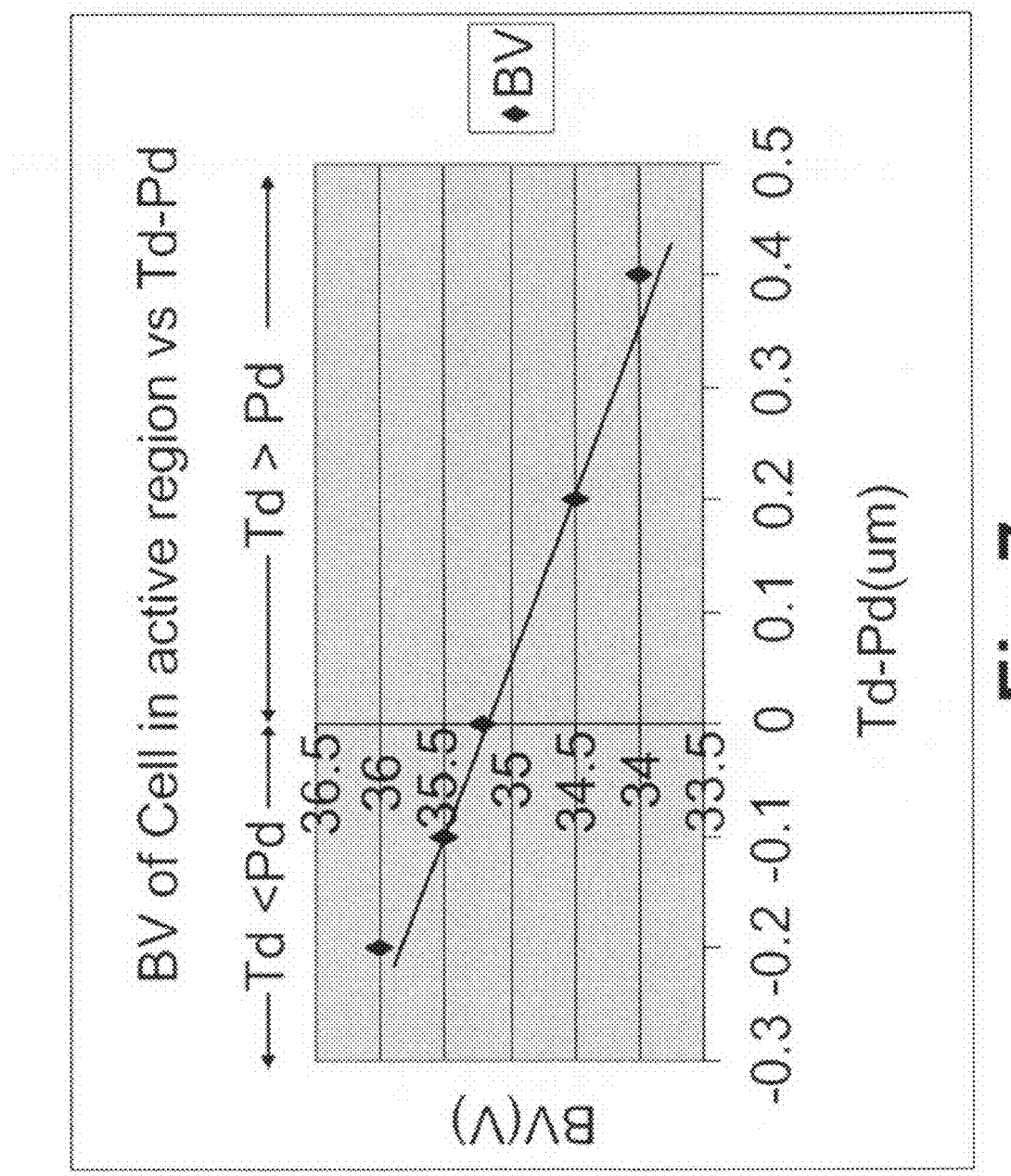
FIG. 7 is an experimental curve showing the relationship between breakdown voltage (BV) in active region and the difference between depth of trenched gates in active region and body region (Td—Pd).
Figure 8:
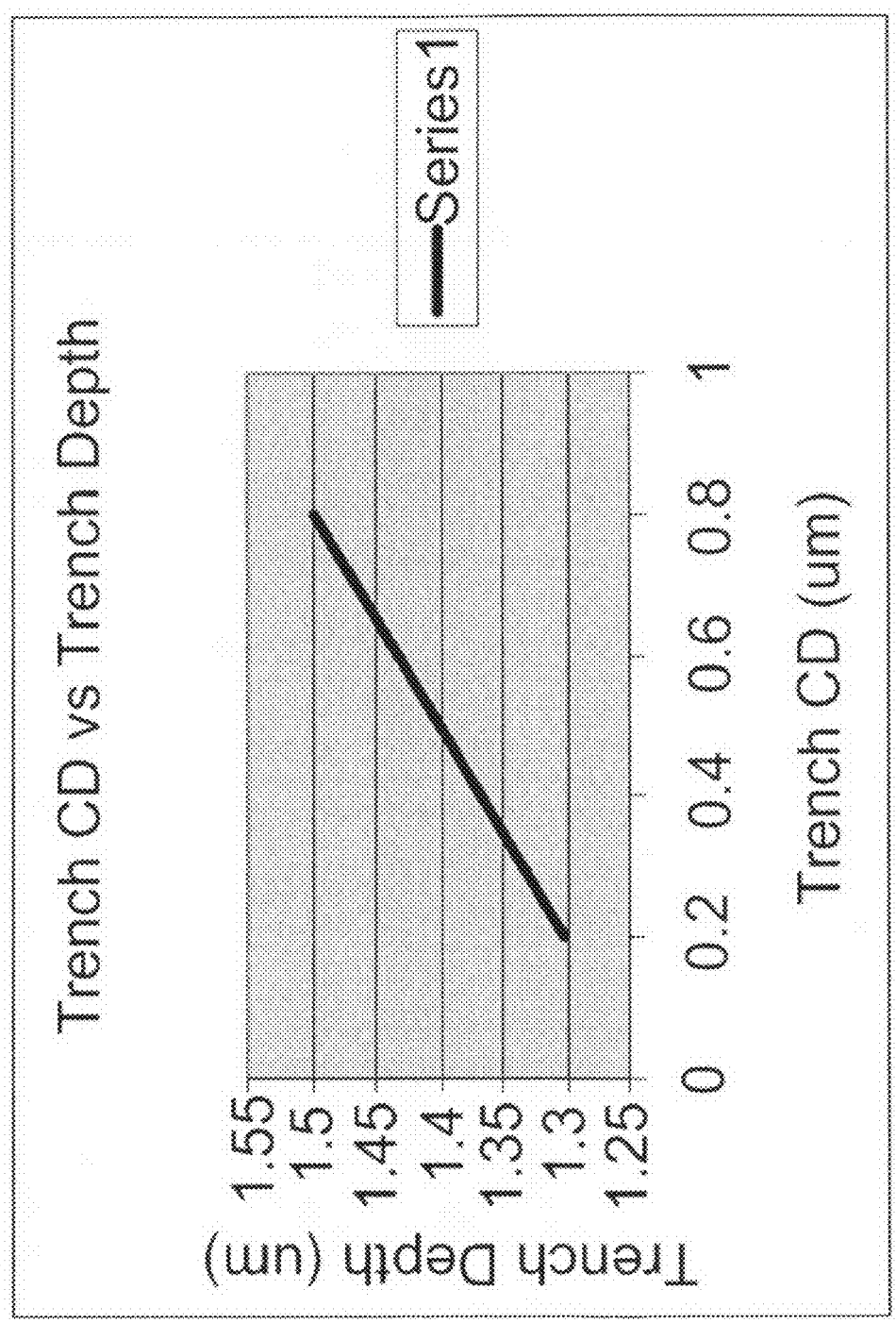
FIG. 8 is an experimental curve showing the relationship between trench CD (Critical Dimension) and trench depth.

FIG. 6 shows another preferred embodiment of the present invention, which is also the $Y_1$-$Y_2$ cross section of FIG. 4, where the disclosed trench MOSFET cell has a similar structure to that in FIG. 3 except that, the plurality of third type trenched floating gates 311 in termination area have same trench width and trench depth which area wider and deeper than the plurality of first type trenched gates 310 in active area. Meanwhile, the depth of said plurality of first type trenched gates 310 (Td, as shown in FIG. 3) are shallower than the junction depth of the first type P body region 314 to keep enough breakdown voltage in active area and lower gate to drain charge Qgd for the reason that, as shown in FIG. 7, when Td is deeper, the breakdown voltage is lower in active area and the Qgd is thus higher. By referring the FIG. 8 showing a relationship between trench depth and trench width, the structure can be achieved with single trench etch because the trench floating gates 311 have trench width wider than the first type trenched gates 310, resulting in deeper trench in the trench floating gates than the first type trenched gate. The preferred embodiment has low gate charge due to shallow trench depth while the breakdown voltage is able to be maintained in termination area without adding extra trench etch.

Figure 9:
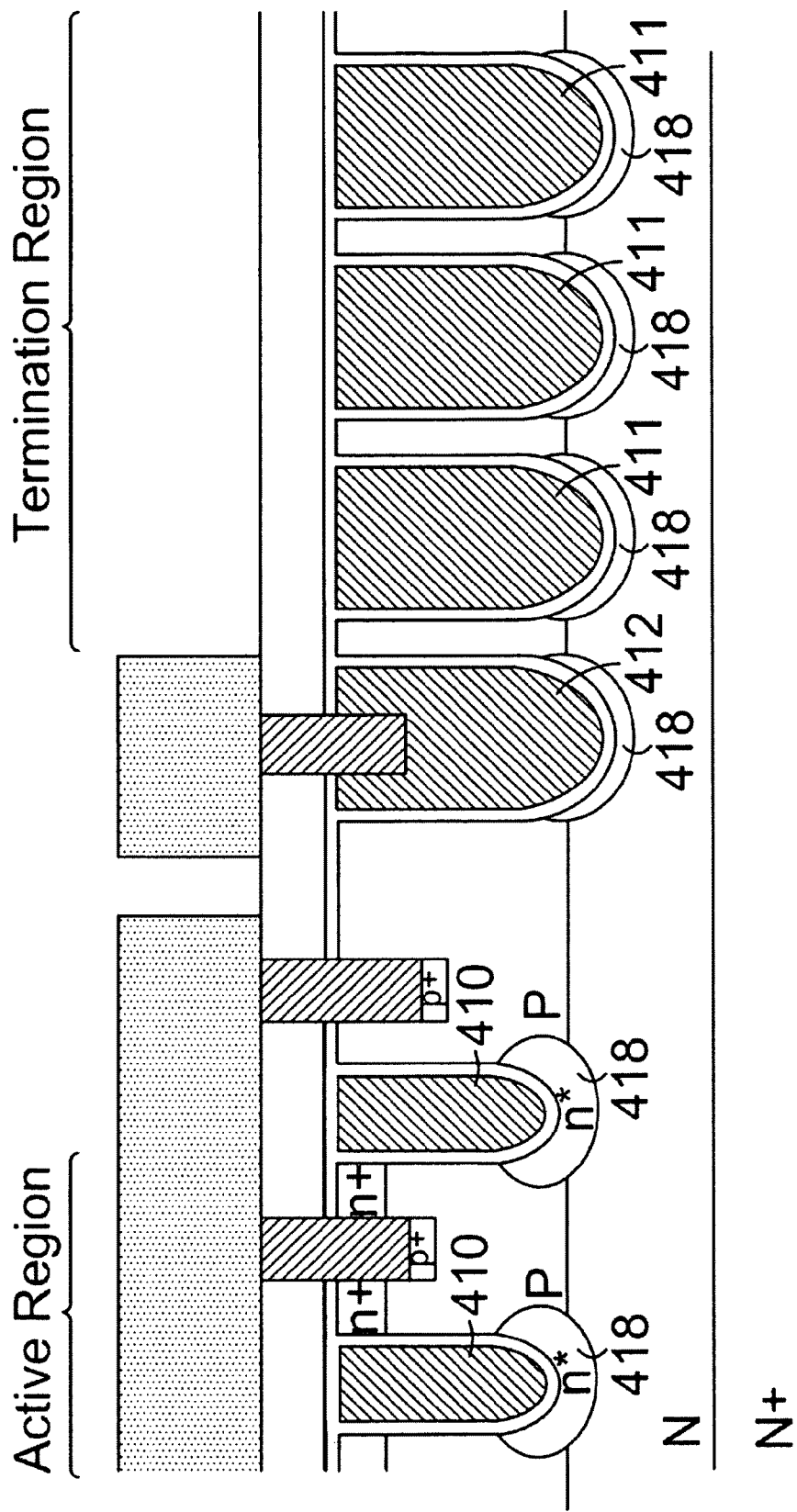
FIG. 9 is a cross-sectional view of another preferred embodiment according to the present invention.

FIG. 9 shows another preferred embodiment of the present invention where the disclosed trench MOSFET cell has a similar structure to that in FIG. 6 except that, underneath the trench bottom of each of said plurality of first type trenched gates 410, said at least a wider second type trenched gates 412 and said plurality of third type trenched gates 411, an n* doped region 418 is formed wrapping the trench bottom to further reduce drain to source resistance Rds.

Figure 10:
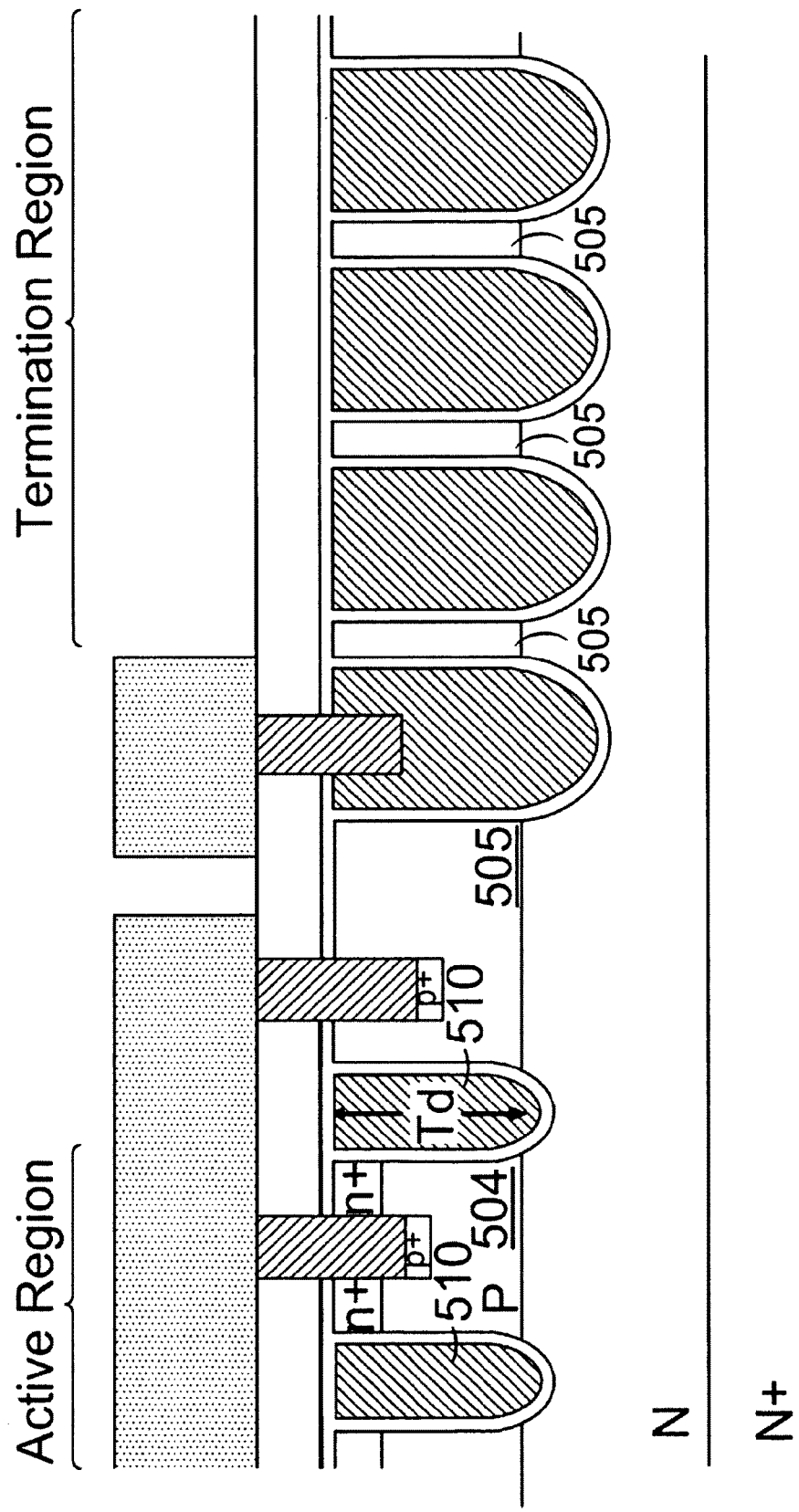
FIG. 10 is a cross-sectional view of another preferred embodiment according to the present invention.

FIG. 10 shows another preferred embodiment of the present invention where the disclosed trench MOSFET cell has a similar structure to that in FIG. 6 except that, the depth of said plurality of trenched gates 510 in active area is deeper than the depth of the first type P body region 504 and the second type P body region 505.

Figure 11:
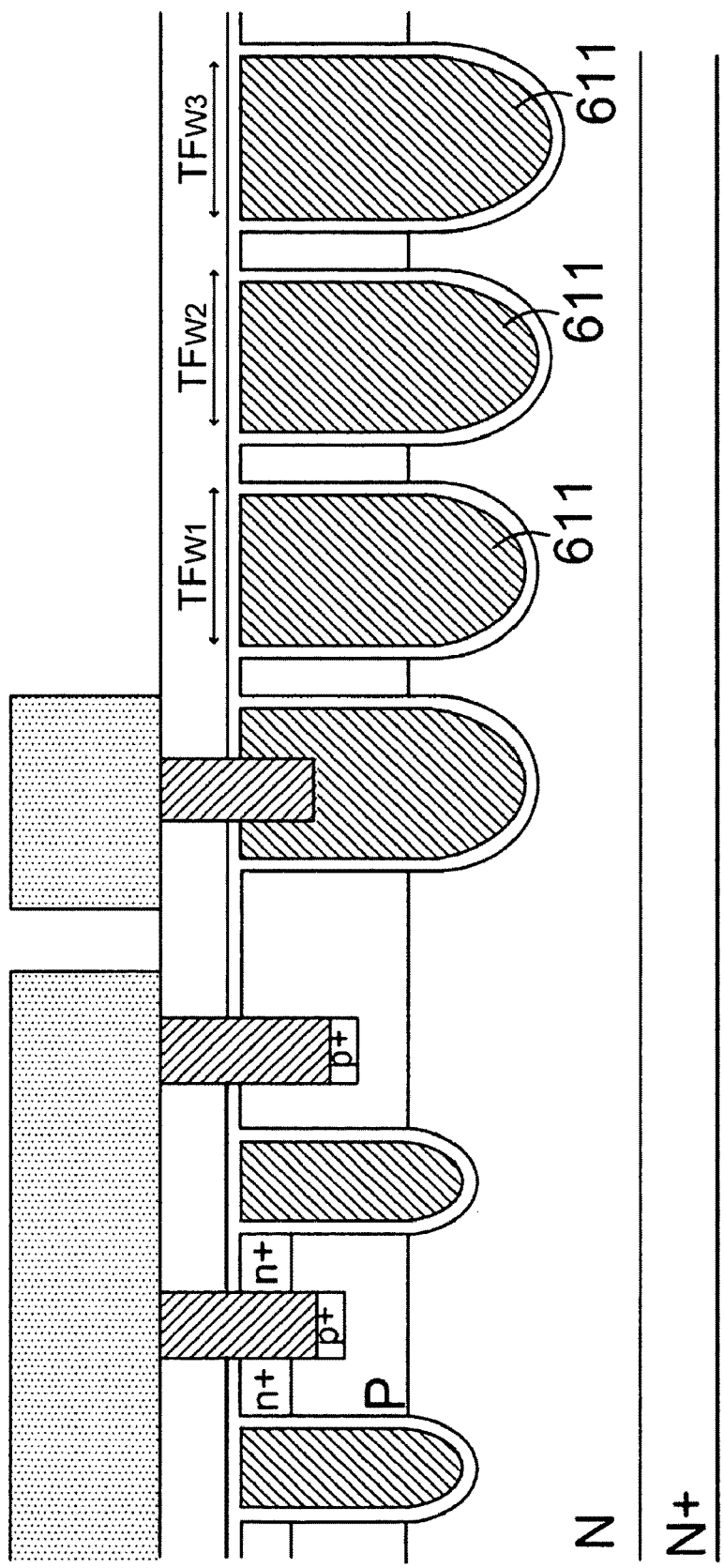
FIG. 11 is a cross-sectional view of another preferred embodiment according to the present invention.

FIG. 11 shows another preferred embodiment of the present invention where the disclosed trench MOSFET cell has a similar structure to that in FIG. 10 except that, in the termination area, the plurality of third type trenched floating gates 611 have different trench width which are deeper and wider than the plurality of first type trenched gates 610 in active area. More specifically, the trench width of said plurality of third type trenched floating gates 611 increases toward the edge of said termination area ($TFw_1$<$TFw_2$<$TFw_3$), which indicates that, the depth of said plurality of third type trenched floating gates 611 also increases toward the edge of said termination area according to FIG. 8. Alternatively, the depth of said plurality of third type trenched floating gates 611 decreases toward the edge of said termination area ($TFw_1$>$TFw_2$>$TFw_3$> . . . ).

Figure 12:
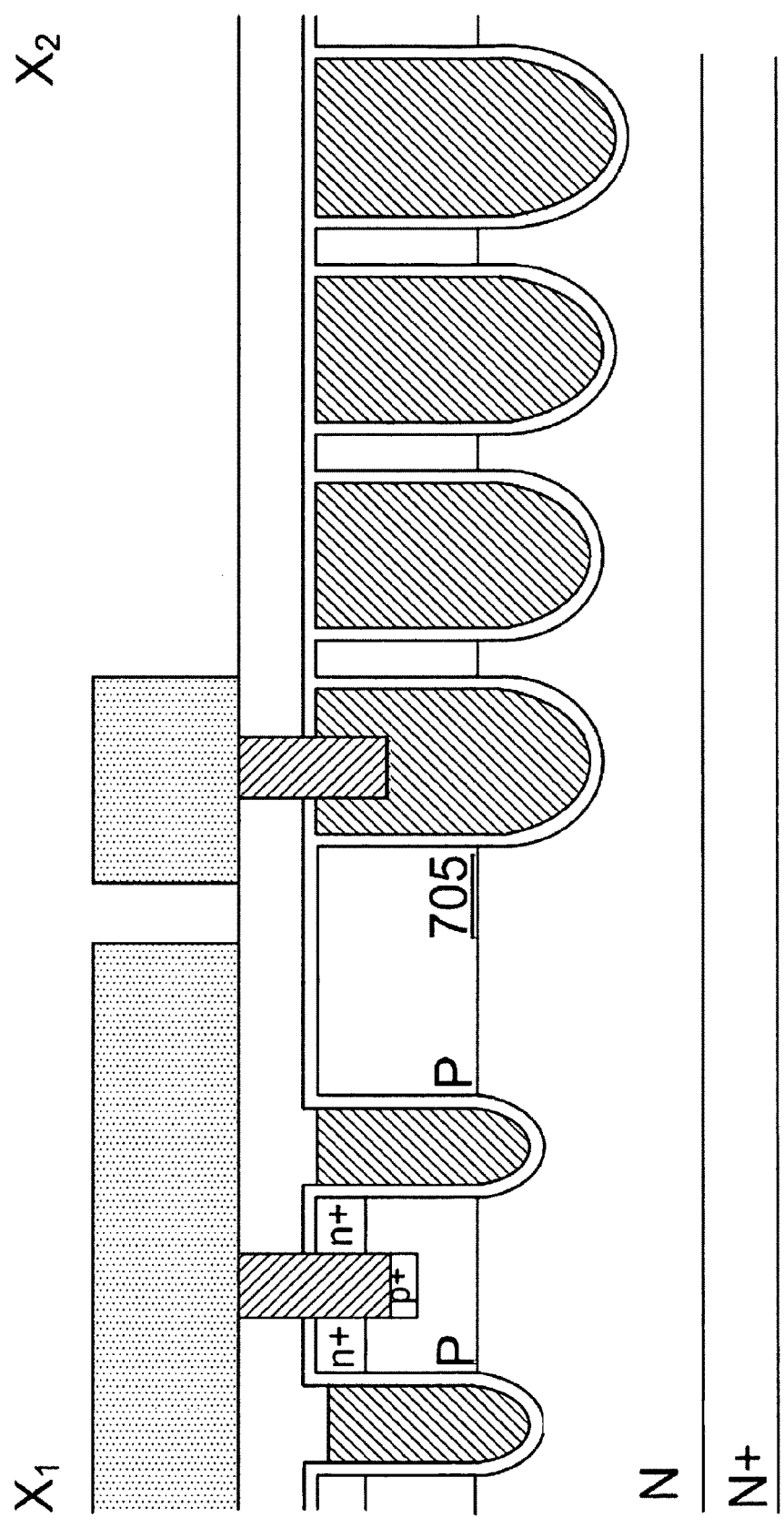
FIG. 12 is a cross-sectional view of another preferred embodiment according to the present invention.
Figure 13:
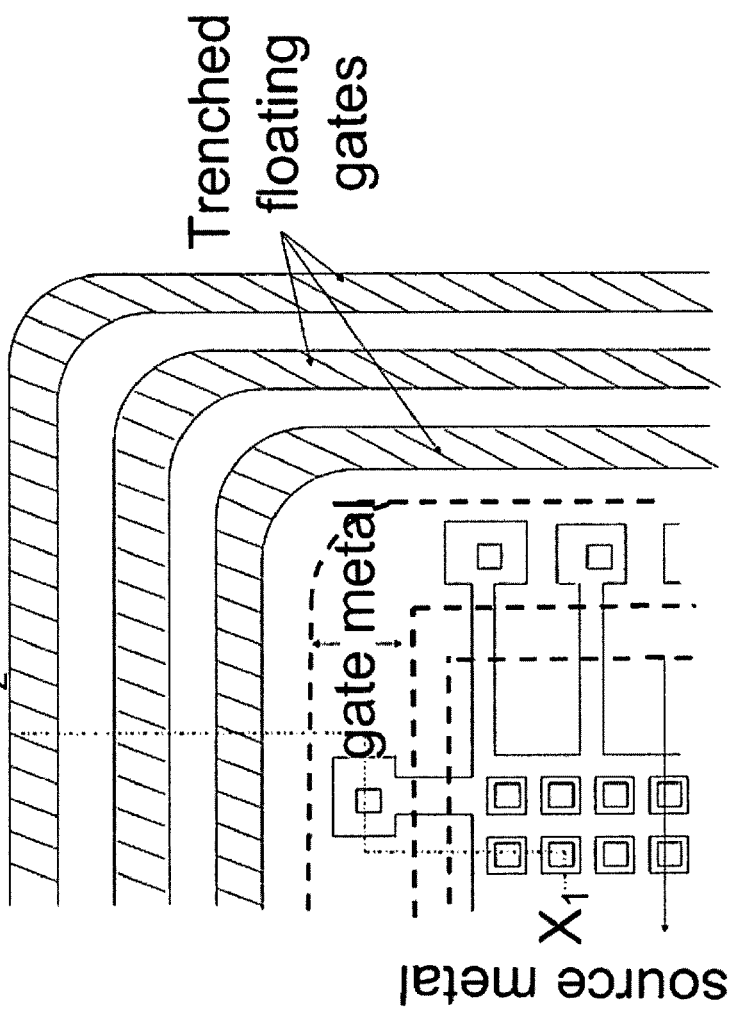
FIG. 13 is a top view of closed cell without trenched body contact according to the present invention.
Figure 14:
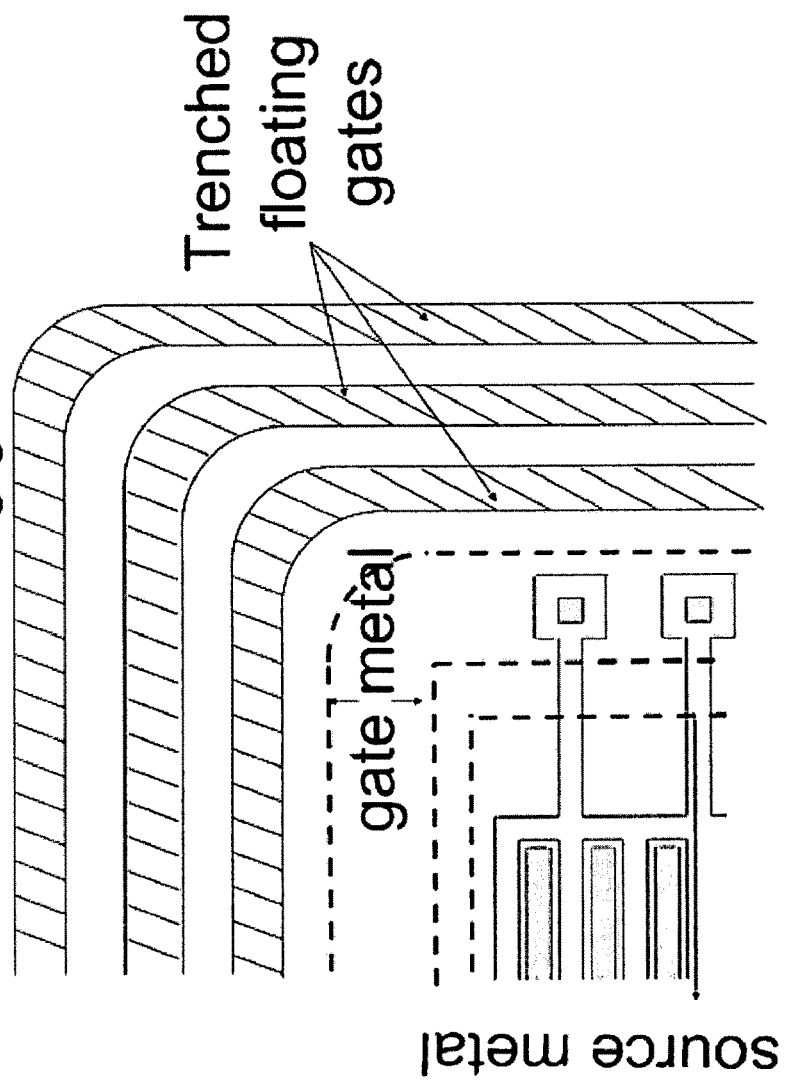
FIG. 14 is a top view of stripe cell without trenched body contact according to the present invention.

FIG. 12 shows another preferred embodiment of the present invention, which is also the $X_1$-$X_2$ cross section in FIG. 13, where the disclosed trench MOSFET cell has a similar structure to that in FIG. 11 except that, there is no trenched body contact extending into the second type P body region 705 so that the second type body regions 705 between the first trenched gate and the adjacent trenched floating gate are not connected to source region and have floating voltage. Said N-channel trench MOSFET further comprises a plurality of closed transistor cells, having top view as shown in FIG. 13 or a plurality of stripe transistor cells, as shown in FIG. 14.

Figure 15B:
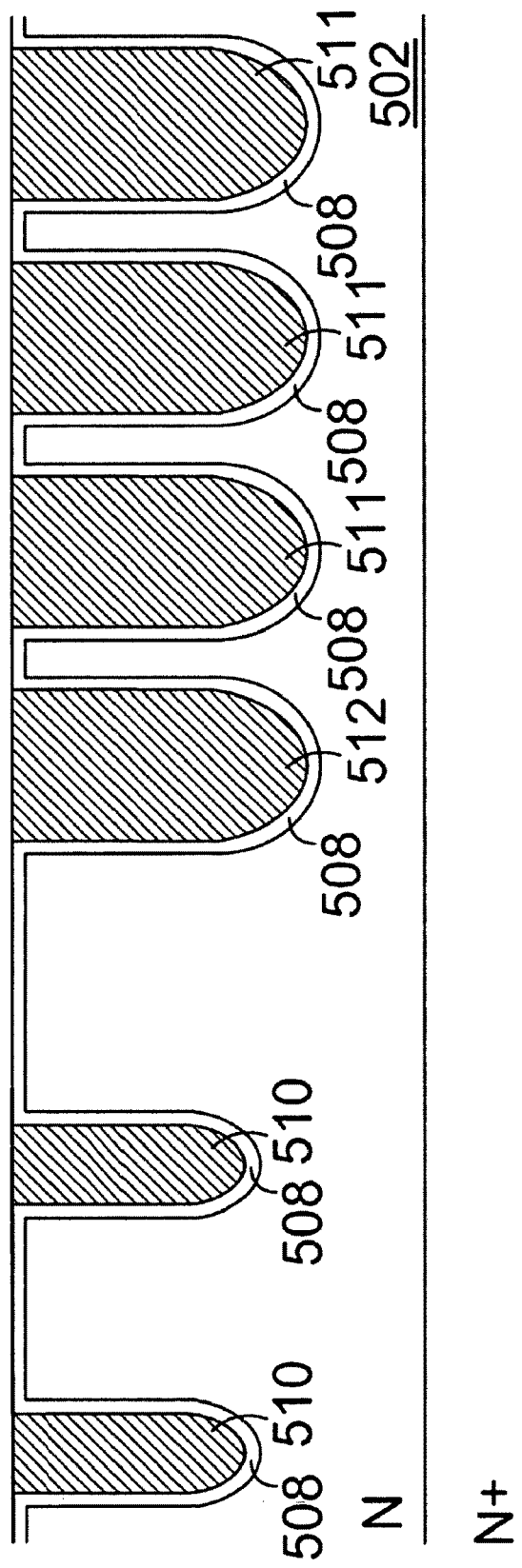

FIGS. 15A to 15E area a series of exemplary steps that are performed to form the inventive trench MOSFET with trenched gates as termination area in FIG. 10. In FIG. 15A, an N doped epitaxial layer 502 is grown on an N+ doped substrate 500. A trench mask (not shown) is applied onto said epitaxial layer 502 for the formation of a plurality of gate trenches by dry silicon etching. The most important is that, the gate trenches in active area and in termination area are etched in different openings to make different trench depths, and the gate trench in termination area is deeper and wider than gate trenches in active area. In FIG. 15B, a sacrificial oxide (not shown) is first grown and then removed to eliminate the plasma damage introduced during opening those gate trenches in FIG. 15A. After that, a gate oxide 508 is formed along the inner surface of all gate trenches and the top surface of said epitaxial layer 502 between every two adjacent gate trenches. Then, onto said gate oxide 508, doped poly is deposited and then etched back by CMP (Chemical Mechanical Polishing) or plasma etching to fill all gate trenches to form a plurality of first type trenched gates 510 in active area, at least a wider second type trenched gate 512 for gate connection and a plurality of third type trenched gates 511 in termination area.

Figure 15C:
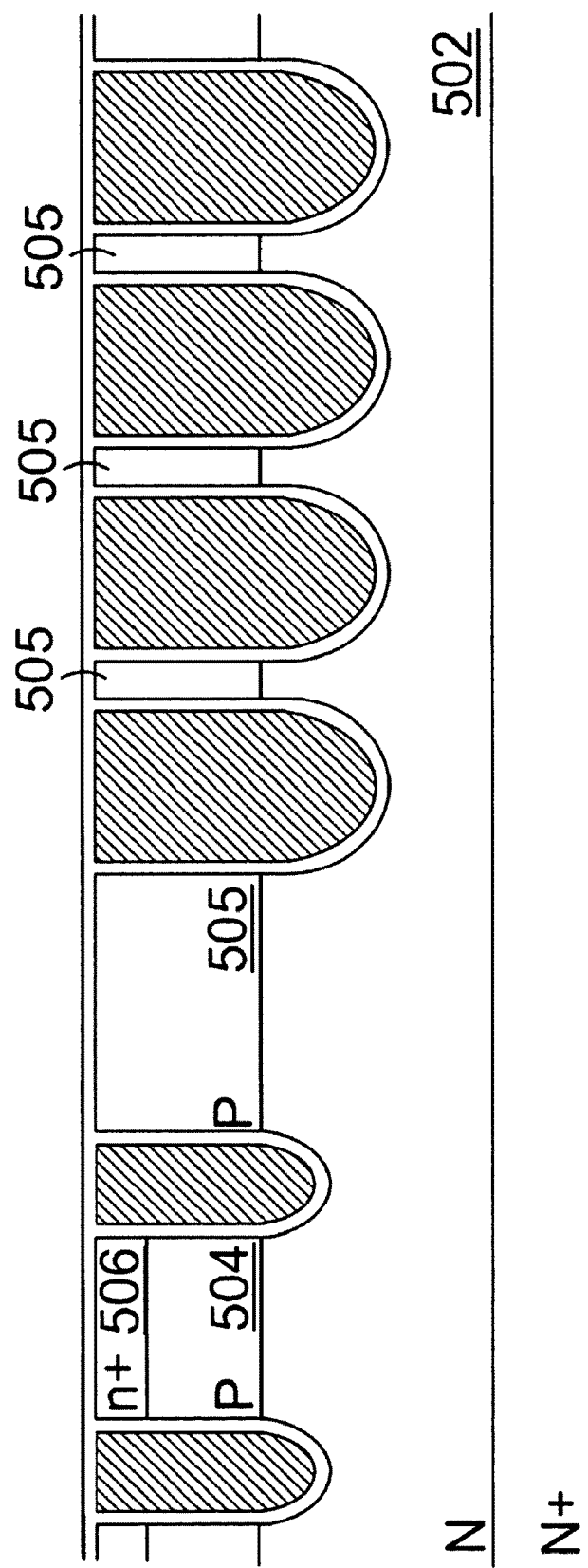

In FIG. 15C, an ion implantation of P type dopant is carried out to form the first type P body regions 504 and the second type P body regions 505 in upper portion of said N epitaxial layer 502 by a P dopant diffusion. Then, after applying a source mask (not shown), another ion implantation of N type dopant is carried out to form said n+ source regions 506 near top surface of said first type P body regions 504 in active area.

In FIG. 15D, a thick oxide layer 516 is deposited on top of said N-channel MOSFET cell as contact interlayer, then after forming a contact mask (not shown), a plurality of contact trenches are formed. Among those contact trenches, a plurality of contact trenches 513' are etched through said thick oxide layer 516, said n+ source regions 506 and extending into said first type P body region 504; at least a contact trench 514' is etched through said thick oxide layer 516 and extending into said second type P body region 505; at least a contact trench 515' is etched through said thick oxide layer 516 and extending into the doped poly in said at least a wider second type trenched gate 512. Then, a blank ion implantation of P type dopant is carried out to form p+ body contact region 517 underneath each trench bottom of contact trench 513' and contact trench 514'.

Figure 15E:
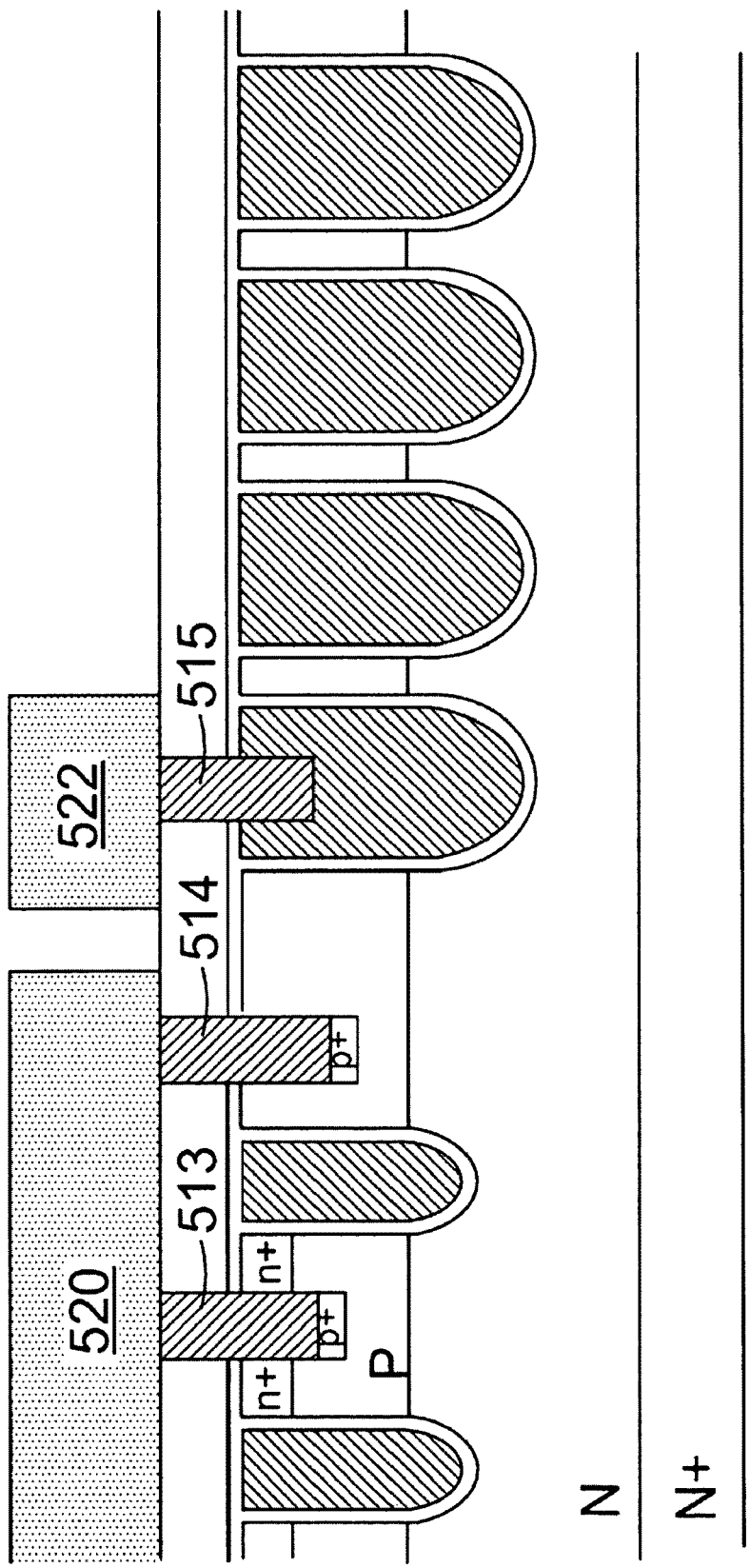

In FIG. 15E, after the deposition of a barrier layer of Ti/TiN or Co/TiN or Ta/TiN, tungsten metal is deposited filling all said plurality of contact trenches 513' to from trenched source-body contact 513, and filling said at least a contact trench 514' and 515' to form trenched body contact 514 and trenched gate contact 515. Then, a resistance reduction metal layer Ti or Ti/TiN and a front metal layer are successively deposited and patterned by a metal mask (not shown) to form source metal 520 and gate metal 522.

Although the present invention has been described in terms of the presently preferred embodiments, it is to be understood that such disclosure is not to be interpreted as limiting. Various alternations and modifications will no doubt become apparent to those skilled in the art reading the above disclosure. Accordingly, it is intended that the appended claims be interpreted as covering all alternations and modifications as fall within the true spirit and scope of the invention.

What is claimed is:

1. A trench MOSFET with a plurality of transistor cells in active area and multiple trenched floating gates in termination area, comprising:
    a substrate of a first conductivity type;
    an epitaxial layer of said first conductivity type grown on said substrate, said epitaxial layer having a lower doping concentration than said substrate;
    a plurality of source regions of said first conductivity type formed near top surface of said epitaxial layer only within said active area, said source regions having a doping concentration higher than said epitaxial layer;
    a plurality of first type body regions of a second conductivity type formed beneath said source regions in said active area;
    a plurality of second type body regions of said second conductivity type formed into said epitaxial layer from top surface of said epitaxial layer around outside of said active area including said termination area;
    said source regions being not disposed in the top of said second type body regions;
    an insulation layer formed on said epitaxial layer;
    a plurality of first type gate trenches in active area surrounded by said source regions and said first type body regions, extending into said epitaxial layer and filled with gate conductive layer over gate oxide layer as first type trenched gates of said transistor cells for current conduction;
    at least one second type trenched gate having gate oxide layer formed thereon, said second trenched gate being wider and deeper than said first type trenched gates, surrounded by said second type body region and extending into said epitaxial layer and filled with gate conductive layer as trenched gates for gate connection;
    at least three third type trenched gates in parallel formed in termination area around outside of said active area having said gate oxide layer formed thereon, said third type trenched gates surrounded by said second type body region and extended into said epitaxial layer and filled with said gate conductive layer as trenched floating gates with floating voltage for sustaining breakdown voltage in termination area, said third type trenched gates having trench depth equal to or deeper than body junction of said second type body regions;
    each said second type body region between two adjacent said trenched floating gates in termination area having floating voltage;
    a plurality of trenched source-body contacts filled with metal plugs padded by a barrier layer, each penetrating through said insulation layer and one of said source regions and extending into one of said first type body regions between two adjacent said first type trenched gates, said metal plugs being connected to a first metal layer formed on said insulation layer as source metal;
    at least one trenched gate contact filled with said metal plug padded by said barrier layer, penetrating through said insulation layer and extending into said gate conductive layer, said metal plug being connected to a second metal layer on said insulation layer serving as gate metal; and
    a drain metal on rear side of said substrate.

2. The MOSFET of claim 1 further comprising a body contact region of said second conductivity type underneath each of said plurality of trenched source-body contact, said body contact region having a higher doping concentration than said first body region.

3. The MOSFET of claim 1, wherein said third type trenched gates as trenched floating gates in said termination area have same trench width and depth as said first type trenched gates in said active area.

4. The MOSFET of claim 1, wherein said third type trenched gates as trenched floating gates in said termination area have wider trench width than said first type trenched gates in said active area.

5. The MOSFET of claim 1, wherein the width of said third type trenched gates as trenched floating gates in termination area increases toward the edge of said termination area.

6. The MOSFET of claim 1, wherein the width of said third type trenched gates as trenched floating gates in termination area decreases toward the edge of said termination area.

7. The MOSFET of claim 1, wherein said first type trenched gates in active area are equal to or shallower than said first type body region.

8. The MOSFET of claim 1, wherein said first type trenched gates in active area are deeper than said first type body region.

9. The MOSFET of claim 7, wherein there is a doped region of said first conductivity type with doping concentration higher than said epitaxial layer wrapping each bottom of said plurality of said first type trenched gates in active area, said second type trenched gate for gate connection and said third type trenched gates in termination area.

10. The MOSFET of claim 1, wherein the trench space between every two adjacent of said third type trenched gates in termination area is equal.

11. The MOSFET of claim 1, wherein the trench space between every two adjacent of said third type trenched gates in termination area is increased toward the edge of said termination area.

12. The MOSFET of claim 1, wherein said metal plug is Tungsten (W) or Al alloys.

13. The MOSFET of claim 1, wherein said barrier layer is Ti/TiN or Co/TiN or Ta/TiN.

14. The MOSFET of claim 1 further comprising a resistance reduction layer Ti or TiN padded between said source metal and metal plugs, and said gate metal and metal plugs.

15. The MOSFET of claim 1, wherein said source metal and said gate metal are Al alloys, Cu or Ni/Ag.

16. The MOSFET of claim 1, wherein said plurality of transistor cells are closed cells.

17. The MOSFET of claim 1, wherein said plurality of transistor cells are stripe cells.

18. The MOSFET of claim 1, wherein said second type body regions between said second type trenched gate and adjacent said third type trenched gate are electrically connected to said source region.

19. The MOSFET of claim 1, wherein said second type regions between said second type trenched gate and adjacent said third type trenched gate is not electrically connected to said source regions and have floating voltage.

20. The MOSFET of claim 1 further comprising a trenched body contact filled with said metal plug padded by said barrier layer, penetrating through said insulation layer and extending into said second type body region between said first type trenched gate and adjacent said second type trenched gate, said metal plug being connected to said source metal.

21. The MOSFET of claim 20 further comprising a body contact region underneath each of said trenched body contact, said body contact region having said second conductivity type with higher doping concentration than said second type body regions.

22. The MOSFET of claim 1, there is no said trenched body contact of claim 20 into said second type body region between said first type trenched gates and adjacent said second type trenched gate.

* * * * *